United States Patent [19]
Bryant et al.

[11] Patent Number: 5,856,233
[45] Date of Patent: Jan. 5, 1999

[54] METHOD OF FORMING A FIELD PROGRAMMABLE DEVICE

[75] Inventors: Frank Randolph Bryant, Denton; Fusen E. Chen; Girish Anant Dixit, both of Dallas, all of Tex.

[73] Assignee: STMicroelectronics, Inc., Carrollton, Tex.

[21] Appl. No.: 434,179

[22] Filed: May 3, 1995

Related U.S. Application Data

[62] Division of Ser. No. 258,609, Jun. 10, 1994, Pat. No. 5,493,144, which is a continuation of Ser. No. 152,914, Nov. 12, 1993, abandoned, which is a continuation of Ser. No. 861,204, Mar. 31, 1992, abandoned.

[51] Int. Cl.[6] .................................................. H01L 21/44
[52] U.S. Cl. .................. 438/600; 438/131; 148/DIG. 55
[58] Field of Search ........................... 437/922; 257/530; 438/600, 467, 131, DIG. 55

[56] References Cited

U.S. PATENT DOCUMENTS

| | | | |
|---|---|---|---|
| 4,599,705 | 7/1986 | Holmberg et al. | 365/163 |
| 4,795,720 | 1/1989 | Kawanabe et al. | 257/529 X |
| 5,070,384 | 12/1991 | McCollum et al. | 437/193 |
| 5,100,827 | 3/1992 | Lytle | 437/52 |
| 5,166,556 | 11/1992 | Hsu et al. | 437/922 |
| 5,250,464 | 10/1993 | Wong et al. | 437/922 |
| 5,272,101 | 12/1993 | Forouhi et al. | 437/50 |
| 5,272,666 | 12/1993 | Tsang et al. | 365/96 |
| 5,328,865 | 7/1994 | Boardman et al. | 437/60 |
| 5,527,745 | 6/1996 | Dixit et al. | 437/60 |

FOREIGN PATENT DOCUMENTS

| | | |
|---|---|---|
| 0250078 | 12/1987 | European Pat. Off. . |
| 0323078A2 | 7/1989 | European Pat. Off. . |
| 0414361 | 2/1991 | European Pat. Off. . |
| 0452091 | 10/1991 | European Pat. Off. . |
| 0457463 A2 | 11/1991 | European Pat. Off. . |
| 1004073 | 1/1989 | Japan .................................. 257/529 |
| 2222024 | 2/1990 | United Kingdom . |

OTHER PUBLICATIONS

Liu et al., "Scaled Dielectric Antifuse Structure for Field–Programmable Gate Array Applications," IEEE Electron Device Letters, vol. 12, No. 4 Apr. 1991, New York, USA, pp. 151–153.

*Primary Examiner*—Jey Tsai
*Attorney, Agent, or Firm*—David V. Carlson; Theodore E. Galanthay; Lisa K. Jorgenson

[57] ABSTRACT

A method is provided for forming a field programmable device of a semiconductor integrated circuit, and an integrated circuit formed according to the same. A first conductive layer is formed. A first, fusible, dielectric layer is formed over the first conductive layer. The dielectric layer is patterned and etched to form a plurality of dielectric regions exposing portions of the first conductive layer. A second dielectric layer is then formed over the dielectric regions and the exposed portions of the first conductive layer. A plurality of contact openings through the second dielectric layer are formed to expose portions of the first conductive layer and portions of the dielectric regions. A second conductive layer is then formed over the second dielectric layer and in the contact openings.

25 Claims, 1 Drawing Sheet

METHOD OF FORMING A FIELD PROGRAMMABLE DEVICE

This is a Division of application Ser. No. 08/258,609, filed Jun. 10, 1994, now U.S. Pat. No. 5,493,144 which is a continuation of application Ser. No. 08/152,914, filed Nov. 12, 1993, now abandoned, which is a continuation of application Ser. No. 07/861,204, filed Mar. 31, 1992, now abandoned.

FIELD OF THE INVENTION

The present invention relates generally to semiconductor integrated circuit processing, and more specifically to a field programmable device.

BACKGROUND OF THE INVENTION

The development of thin film fuse technology has allowed for the creation of field programmable memory circuits. The fuse provides for field programming of data in the memory array portion of the chip. In one application, the fuse is not a protective device, but instead is specifically blown or disabled. The memory cells in the memory array which are not needed are disabled by blowing the fuse. Once the fuse is blown, those associated memory cells are permanently removed from the circuit.

In another application, the fuse acts as a protective device. The material comprising the fuse is formed between two conductive layers. When the fuse is ruptured, the conductive layers are allowed to migrate across the fuse material and make electrical contact. This use of a fuse has specific applications in the field programming of Application Specific Integrated Circuits (ASICs).

In the prior art, an undoped polysilicon layer was formed between two metal layers. During programming, if there was a need for an electrical contact between these two metal layers, the polysilicon was ruptured. The potential of the undoped polysilicon was raised high enough to allow the metal to migrate through or alloy with the polysilicon. The resistance of the polysilicon was lowered enough to form an electrical contact between the two metals.

One disadvantage of using polysilicon between two conductive layers is that there will be leakage current across the polysilicon when a voltage is applied to the conductive layers. It would therefore be desirable to form an improved electrically fusible device which does not conduct current across the fusible layer when voltage is applied to the conductive layers. It would be desirable to use a dielectric layer between the two conductive layers. It would further be desirable to for such method to be compatible with current process techniques.

SUMMARY OF THE INVENTION

The invention may be incorporated into a method for forming a semiconductor device structure, and the semiconductor device structure formed thereby, by forming a first fusible dielectric layer over a portion of a first conductive layer. A second dielectric layer having a plurality of contact openings is formed exposing a portion of the first dielectric and a portion of the first conductive layer. A second conductive layer is formed over a portion of the second dielectric layer and in the contact openings over the exposed first dielectric layer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
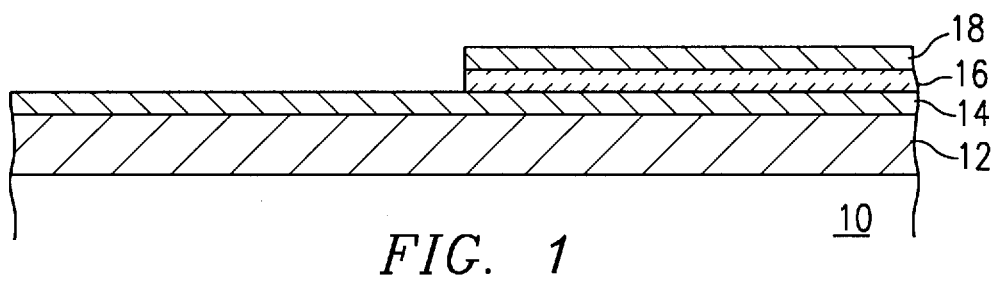
FIGS. 1–2 are cross sectional views of the fabrication of a semiconductor integrated circuit according to the present invention.

Referring to FIG. 1, a conductive layer 12 is formed over the integrated circuit. Layer 12 may be metal 1 and typically usually comprises aluminum. Layer 12 has been patterned and etched to form vias or contacts to lower conducting structures as known in the art. A first refractory metal layer 14 is formed over the conductive layer 12. A fusible dielectric layer 16 is formed over the first refractory metal layer 14. The fusible dielectric layer 16 may preferably comprise a metal oxide, silicon dioxide or silicon nitride. A second refractory metal layer 18 is formed over the first fusible dielectric layer 16. This forms a sandwich structure of layers 14, 16, and 18. Layers 16 and 18 are then patterned and etched to expose portions of the underlying first refractory metal layer 14. Alternatively, layer 14 may be etched sequentially with layers 16 and 18 exposing portions of the underlying conductive layer 12. Layer 18 will help preserve the integrity of the dielectric layer 16 during subsequent processing steps and will act as an etch stop during subsequent etch steps. Layers 14 and 16 will act as an etch stop layer during a subsequent etch process for the layer above it. Layer 14 may also act as an anti-reflective coating (ARC) to reduce photoresist pattern deformation due to reflected light. The refractory metal layers 14 and 18 may comprise a refractory metal nitride such as titanium nitride.

Figure 2:
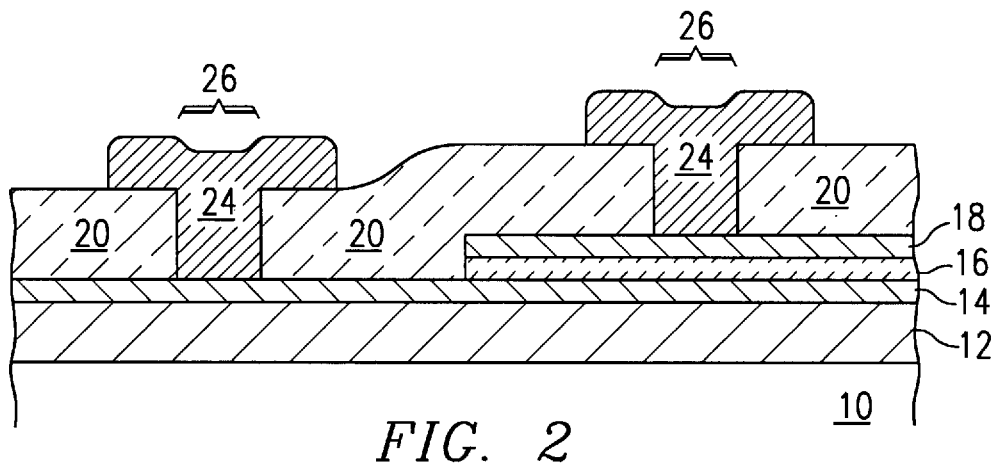

Referring to FIG. 2, a second dielectric layer 20 is formed over the second refractory metal layer 18 and the exposed portions of the first refractory metal layer 14. The second dielectric layer 20 is typically an interlevel dielectric layer comprised of oxide. The layer 20 is then patterned and etched to form a plurality of contact openings 26. Depending upon the pattern required, contact openings 26 will be made to selected portions of the underlying first refractory metal layer 14 and portions of the second refractory metal layer 18. A second conductive layer 24 is then formed over the second dielectric layer 20 and in the contact openings 26. In an alternative embodiment, refractory metal layers 14 and 18 are not formed. The fusible dielectric layer 16 is formed over the conductive layer 12, then patterned and etched according to the steps above.

Operating voltages of ASIC devices, for example, are around 5 volts for Vcc. Programming voltages, on the other hand, are in the range of 10 to 12 volts. The thickness of the fusible dielectric must therefore be sufficient to prevent breakdown or premature wearout at standard operating voltages. The dielectric layer must have a maximum thickness, however, which allows breakdown to occur at typical programming voltages. If the fusible dielectric material, for example, is silicon dioxide, the thickness of the dielectric is between approximately 50 to 140 angstroms. A thickness under approximately 50 angstroms would allow breakdown to occur at typical operating voltages. A thickness greater than approximately 140 angstroms would not allow for breakdown to occur at typical programming voltages. The use of a dielectric material between two conductive structures of the appropriate thickness will allow for selective rupturing of the dielectric during field programming while maintaining the integrity of the device at operating voltages by preventing leakage current from flowing through the dielectric.

While the invention has been particularly shown and described with reference to a preferred embodiment, it will be understood by those skilled in the art that various changes in form and detail may be made therein without departing from the spirit and scope of the invention.

What is claimed is:

1. A method of forming a field programmable device of a semiconductor integrated circuit, comprising the steps of:
    forming a first refractory metal layer over a first conductive layer;
    forming a first, fusible, dielectric layer on a portion of said first refractory metal layer;
    forming a second refractory metal layer on said first dielectric layer;
    forming one or more contact openings through said second refractory metal layer, first dielectric layer, and first refractory metal layer to expose said first conductive layer;
    forming a second dielectric layer having a plurality of contact openings exposing a portion of said second refractory metal layer; and
    forming a second conductive layer over a portion of said second dielectric layer and in the contact openings over the exposed portions of said second refractory metal layer.

2. The method of claim 1, wherein the first dielectric layer has a thickness equal to or greater than a thickness which prevents breakdown at operating voltages.

3. The method of claim 1, wherein the first dielectric layer has a thickness equal to or greater than a thickness which prevents premature wearout at operating voltages.

4. The method of claim 1, wherein the first dielectric layer has a thickness less than or equal to a thickness which allows breakdown to occur at a programming voltage.

5. The method of claim 1, wherein the first refractory metal layer comprises a refractory metal nitride.

6. A method of forming a field programmable device of a semiconductor integrated circuit; comprising the steps of:
    forming a first conductive layer comprising aluminum;
    forming a first refractory metal layer over said first conductive layer;
    forming a first, fusible, dielectric layer over said first refractory metal layer;
    forming a second refractory metal layer over said first dielectric layer;
    patterning and etching said second refractory metal layer, said first dielectric layer and said first refractory metal layer to form a plurality of dielectric regions and exposing portions of said first conductive layer;
    forming a second dielectric layer over said second refractory metal layer and the exposed portions of said first conductive layer;
    forming a plurality of contact openings through said second dielectric layer exposing portions of said first conductive layer and portions of said second refractory metal layer; and
    forming a second conductive layer over said second dielectric layer and in the contact openings.

7. The method of claim 6, wherein said first dielectric layer has a thickness equal to or greater than a thickness which prevents breakdown at operating voltages.

8. The method of claim 6, wherein said first dielectric layer has a thickness equal to or greater than a thickness which prevents premature wearout at operating voltages.

9. The method of claim 6, wherein the first dielectric layer has a thickness less than or equal to a thickness which allows breakdown to occur at a programming voltage.

10. The method of claim 6, wherein said first dielectric layer comprises a metal oxide.

11. The method of claim 6, wherein said first dielectric layer comprises a silicon dioxide.

12. The method of claim 6, wherein said first dielectric layer comprises a silicon nitride.

13. The method of claim 6, wherein said first refractory metal layer comprises tungsten.

14. The method of claim 6, wherein said second refractory metal nitride layer comprises tungsten.

15. The method of claim 1, wherein said first conductive layer comprises aluminum.

16. The method of claim 1, wherein said first dielectric layer comprises silicon nitride.

17. The method of claim 1, wherein said first dielectric layer comprises silicon oxide.

18. The method of claim 17, wherein said first dielectric layer has a thickness in the range of approximately 50–140 Angstroms.

19. The method of claim 6, wherein said first dielectric layer comprises silicon nitride.

20. The method of claim 6, wherein said first dielectric layer comprises silicon oxide.

21. The method of claim 20, wherein said first dielectric layer has a thickness in the range of approximately 50–140 Angstroms.

22. A method forming a field programmable device of a semiconductor integrated circuit, comprising the steps of:
    forming a first refractory metal layer, comprising tungsten, over a first conductive layer which comprises aluminum;
    forming a first fusible dielectric layer, comprising silicon nitride or oxide, on a portion of said first refractory metal layer;
    forming a second refractory metal layer, comprising tungsten, on the first dielectric layer;
    forming a second dielectric layer having a plurality of contact openings which extend therethrough to expose said first and second refractory metal layers; and
    forming a second conductive layer over a portion of the second dielectric layer and in the contact openings over the exposed portions of said first and second refractory metal layers.

23. The method of claim 22, wherein said first dielectric layer comprises silicon nitride.

24. The method of claim 22, wherein said first dielectric layer comprises silicon oxide.

25. The method of claim 24, wherein said first dielectric layer has a thickness in the range of approximately 50–140 Angstroms.

* * * * *